United States Patent

Kai et al.

[11] Patent Number: 6,043,156
[45] Date of Patent: *Mar. 28, 2000

[54] METHOD OF MAKING SEMICONDUCTOR WAFERS

[75] Inventors: Fumitaka Kai; Masahiko Maeda; Kenji Kawate, all of Miyazaki, Japan

[73] Assignee: Komatsu Electric Metals Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/960,000

[22] Filed: Oct. 29, 1997

[30] Foreign Application Priority Data

Oct. 29, 1996 [JP] Japan ................................. 8-323260

[51] Int. Cl.⁷ .................................................. H01L 21/302
[52] U.S. Cl. ............................................... 438/692; 216/89
[58] Field of Search .................................. 438/691, 692, 438/693; 216/89

[56] References Cited

U.S. PATENT DOCUMENTS

| | | | |
|---|---|---|---|
| 5,422,316 | 6/1995 | Desai | 438/693 |
| 5,494,862 | 2/1996 | Kato et al. | 438/693 |
| 5,643,405 | 7/1997 | Bello et al. | 438/692 |
| 5,800,725 | 9/1998 | Kato et al. | 438/692 |
| 5,821,167 | 10/1998 | Fukami et al. | 438/691 |
| 5,827,779 | 10/1998 | Masumura et al. | 438/691 |
| 5,851,924 | 12/1998 | Nakazawa et al. | 438/691 |
| 5,899,743 | 5/1999 | Kai et al. | 438/691 |

*Primary Examiner*—Benjamin L. Utech
*Assistant Examiner*—Duy-Vu Deo
*Attorney, Agent, or Firm*—Sheridan Ross P.C.

[57] ABSTRACT

It is an object of the present invention to provide a method for efficiently making semiconductor wafers that prevents the production of metal pollution. It is another object of the present invention to provide a method where the back side of the wafer does not influence the front side, thereof, and where the front and back sides of the wafer can be distinguished are polishing.

This invention provides a method for efficiently making semiconductor wafers having uniform thickness where the thickness of the back side does not influence the front side and where the front side of the wafer is capable of being distinguished from the back side. A semiconductor ingot is sliced to obtain wafers. The sliced surfaces of the wafers are flattened. The flattened wafer is etched in alkaline etching solution. Both the front and back sides of the etched wafer are polished using a double sided polishing apparatus so that the front side is a mirror surface and an unevenness remains on the back side to distinguish the front and back sides, thereof. The polished wafer is cleaned.

7 Claims, 5 Drawing Sheets

2(a)

2(b)

2(c)

2(d)

METHOD OF MAKING SEMICONDUCTOR WAFERS

FIELD OF THE INVENTION

This invention relates to a method of making semiconductor wafers which can distinguish front and back sides, thereof, by using a double sided polishing apparatus.

BACKGROUND OF THE INVENTION

Typically, during processing a device which prints a circuit on a semiconductor wafer, the back side of the semiconductor wafer is held by a vacuum chuck, and the front side is polished. The yield rate is decreased because the unevenness of the back side, which is chucked, influences the front side in the processing device. To solve this reduction in yield, the back side must also be polished. As such, both the front and back sides of the semiconductor wafers are simultaneously polished by using a double sided polishing apparatus.

However, problems often occur in the device process. For example, when the semiconductor wafer is polished on both the front and back sides, it becomes very difficult to distinguish the front from back side by visual inspection and sensors which are used to convey and position the wafer.

In JP 6-349795, a method of making semiconductor wafers is disclosed. The method maintains the yield rate during the circuit print of the device process, and the method prevents the problem of distinguishing the front from back sides of the wafer.

In the JP 6-349795 method, a sliced wafer 6 is chamfered (FIG. 6(a)); the sliced surface 61 is flattened by lapping (FIG. 6(b)); the lapped wafer 6 is etched with alkaline solution (FIG. 6(c)); and the back side of wafer 6 is polished to remove most of the unevenness 64 which is formed by the alkaline etching. (FIG. 6(d))

Metal pollution is more difficult to remove from an alkaline etching solution than from an acid etching solution. If the metal radicals of the alkaline solution, such as potassium hydroxide (KOH) or sodium hydroxide (NaOH), remain in the etching solution, these metallic radicals will also constitute part of the metal pollution.

In this method, since the wafers are necessarily polished in side by side processes, the manufacturing efficiency is not optimized. When using a polishing block to polish the wafers, processes are required to adhere and remove the wafers from the polishing block. In this method, not only are the processes increased, but many chemicals are required to clean the wafers and the blocks.

SUMMARY OF THE INVENTION

The present invention is accomplished to solve the above problems. It is an object of the present invention to provide a method for efficiently making semiconductor wafers that prevents the production of metal pollution. It is another object of the present invention to provide a method where the back side of the wafer does not influence the front side, thereof, and where the front and back sides of the wafer can be distinguished.

To achieve the above objects, in one embodiment, a method for making semiconductor wafers comprises the following steps; a semiconductor ingot is sliced to obtain wafers; the sliced surfaces of the wafers are flattened; the flattened wafers are etched in an acid etching solution; both the front and back sides of the etched wafers are polished by using a double sided polishing apparatus so that the front side has a mirror surface and an unevenness is maintained on the back sides to distinguish front and back sides, thereof; and the polished wafers are cleaned.

Further, in another embodiment, a method for making semiconductor wafers comprises the following steps; a semiconductor ingot is sliced to obtain wafers; the sliced surfaces of the wafers are flattened; the surfaces of flattened wafers are washed by an acid washing solution to remove the impurities from the damaged areas which were formed by the flattening step; both the front and back sides of the washed wafers are polished using a double sided polishing apparatus so that the front side has a mirror surface and an unevenness is maintained on the back side to distinguish the front side from the back side thereof; and the polished wafers are cleaned.

In the above prior art methods, metal pollution was created during the production of the semiconductor wafers, and the manufacturing process took a long time. An object of the present invention is to improve the subject matter of the prior art. To this regard, instead of polishing the wafers in side by side processes after alkaline etching, the present invention simultaneously polishes both the front and back sides of the wafers after the wafers are acid etched.

The use of an acid etching solution for etching the wafers provides many advantages. First, acid etching provides an increased rate of etching and acid etching does not produce metal pollution that possibly occurs when an alkaline etching solution is used.

The double sided polishing of the present invention does not polish both the front and back sides of wafers to a mirror surface, but rather the front sides of wafers are polished to mirror surfaces while the back sides, thereof, are polished to produce an unevenness which is used to distinguish the front from the back side. The parameters of the double sided polishing apparatus are set to accomplish the above requirement.

Distinguishing the front and back sides by the unevenness of the back side is, typically, dependent upon the type of sensor used, the skill of those who visually distinguish the sides, the condition of lighting, and so on. For example, assuming the luster of perfect mirror surfaces is 100%, distinguishing the back side using a sensor requires the luster to be about 95% or less. Distinguishing the sides by visual inspection is enhanced using fluorescent lights.

The depth of the work damaged areas formed during the flattening step, such as a lapping process, is about 3 to 10 μm. At least 5 to 30 μm of thickness on one side are etched off by acid etching to remove the above-mentioned work damaged areas.

The peak-to-valley height of wafer surface after acid etching is about 0.3 to 2.0 μm. Therefore, more than this peak-to-valley height must be polished from the front side to obtain a mirror surface, and less than about 0.1 to 1.5 μm of thickness should be polished from the back side to obtain the above-mentioned luster.

DETAILED DESCRIPTION

A polishing method using double sided polishing apparatus is hereby described where the polishing rates of front and back sides of the wafer are different from each another. The luster of a mirror surface is assumed as 100% in this description.

The polishing, in at least one embodiment of the present invention, was conducted under the following conditions. The upper turntable turned in an opposite direction to the lower turntable. The internal gear and sun gear rotated in the same direction as the lower turn table.

Diameter of wafers: 8 inches

The wafers were acid etched.

The peak-to-valley height: 2.0 $\mu$m

The upper turntable turning speed: 10 rev/min

The internal gear turning speed: 10 rev/min

The sun gear turning speed: 10 rev/min

The polish time: 20 minutes

Figure 4:
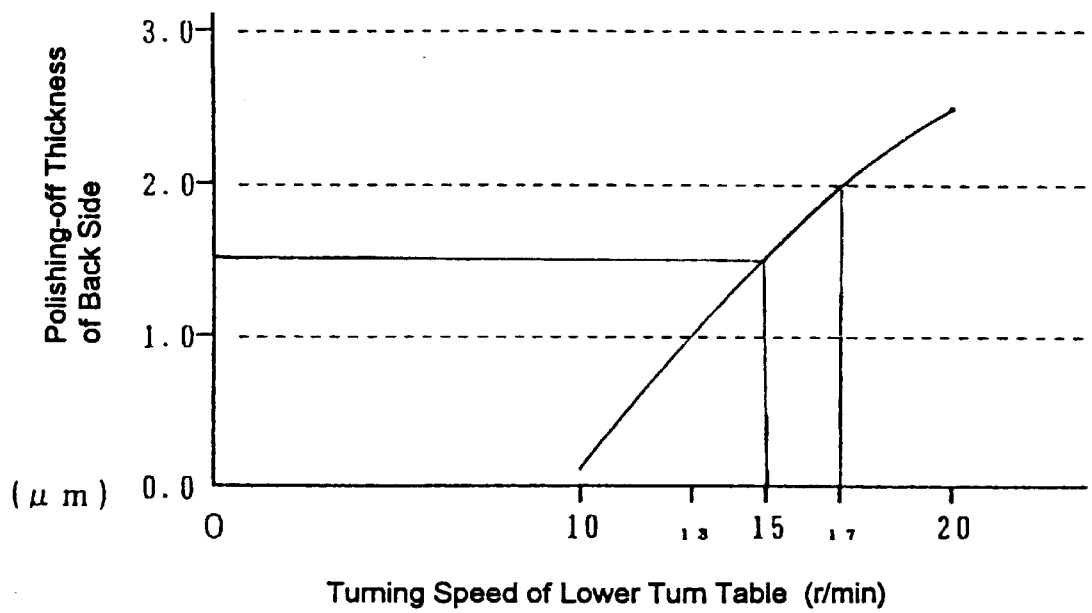
FIG. 4 is a graph which shows the relationship between the turning speed of the lower turn table and the polished-off thickness of the back side.
Figure 5:
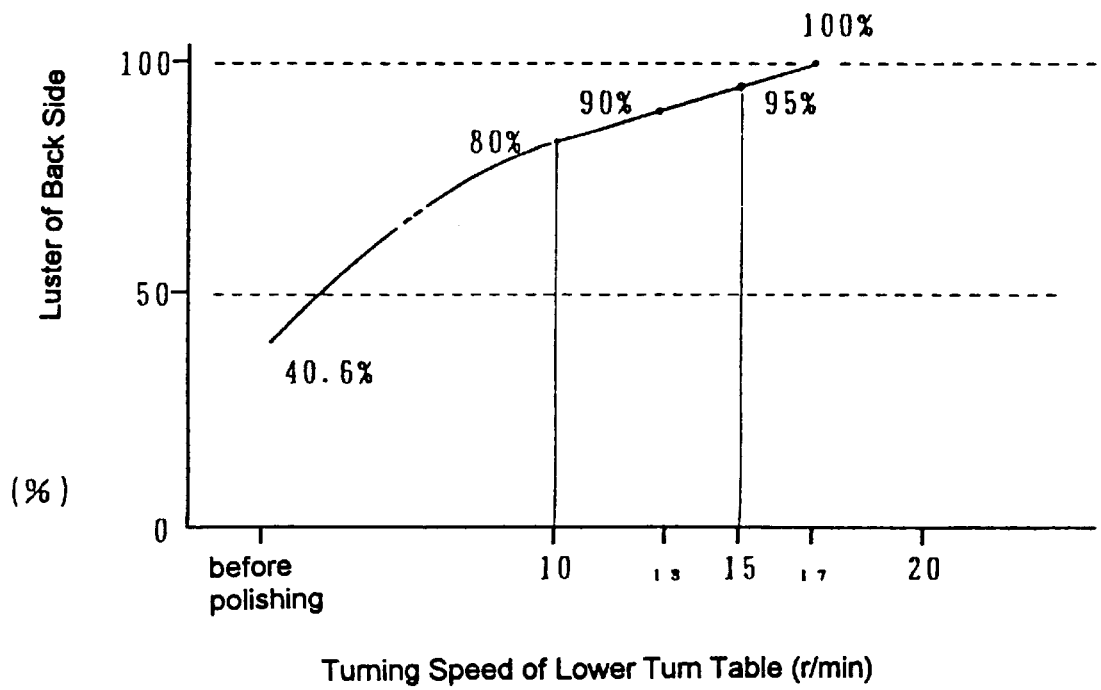
FIG. 5 is a graph which shows relationship between the turning speed of the lower turntable and the luster of the back side.
Figure 6:
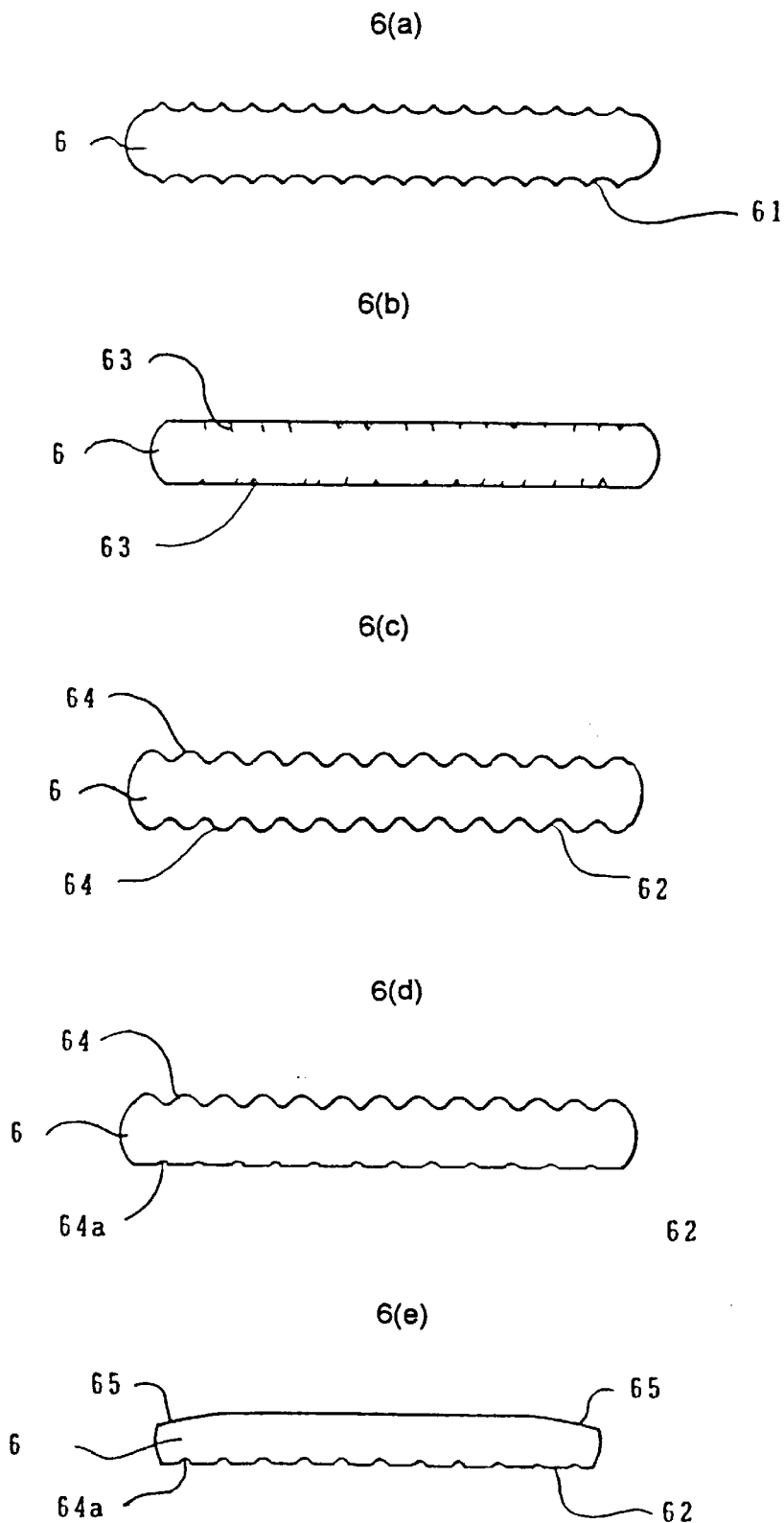
FIG. 6 illustrates sectional side elevations of the semiconductor wafers which are made by the method of the prior art.

Under these conditions, the turning speed of the lower turn table was varied within 10 to 20 rev/min, and the results as shown in FIG. 4 and FIG. 5 were obtained. The change in polished-off thickness and the changes in the luster of the back side of the wafer were analyzed. Incidentally, the polished-off thickness of the front side using the above settings was approximately 10 $\mu$m.

As shown in FIG. 4, the polished-off thickness of the back side reached 0.1 $\mu$m, which was the lowest thickness removed, when the turning speed of the lower turn table was 10 rev/min. As the gearing was changed and the turn speed of the lower turning table increased, the polished-off thickness increased. When the turning speed of the lower turn table was 20 rev/min, the polished-off thickness became 2.5 $\mu$m, which was the largest thickness removed.

Analyzing the luster as shown in FIG. 5, the luster was the lowest when the polished-off thickness was the smallest (0.1 $\mu$m) when the turning speed of the lower turn table was 10 rev/min, and as the polished-off thickness increasing the luster was also increasing.

Distinguishing the front and back sides by the above-mentioned sensor, a luster of about 95% or less is necessary. To obtain a luster in this range, the turning speed of the lower turn table ranged from 10 to 15 rev/min. As shown in FIG. 4, 0.1 to 1.5 $\mu$m of polished-off thickness was obtained from operating the turning speed of the lower turn table in this range. Consequently, the polished-off thickness of back side of the wafer ranges between 1 to 15% of the polished-off thickness of the front side.

Even though the polished-off thickness of front side was 10 $\mu$m in this embodiment and the peak-to-valley height of this embodiment was 2.0 $\mu$m, the luster becomes 100% when the polished-off thickness is approximately 2.0 $\mu$m, as shown in FIG. 4 and FIG. 5. Therefore, the front surface will surely be polished to a mirror surface if the polished-off thickness is 2.5 $\mu$m or more. On the other hand, to distinguish the front and back sides, the required luster of back side can be obtained by polishing-off 1.5 $\mu$m thickness or less. Therefore, it is possible to distinguish the front and back sides if ⅔ or less of the thickness polished-off from the front side is polished off the back side.

It is apparent that the polished-off thickness required to make a mirror surface will become smaller as the peak-to-valley height is decreased. Whereby, in order to obtain the above-mentioned distinguishable luster, a smaller peak-to-valley height will produce a smaller ratio of back side to front side polished-off thickness.

As stated above, when the peak-to-valley height is 2.0 $\mu$m or less, the ratio of back side to front side polished-off thickness is less than about ⅔. Usually, a peak-to-valley height of 0.3 to 2.0 $\mu$m is obtained after acid etching the wafer surface.

Incidentally, in the above embodiment, the double sided polishing apparatus was set so that the upper turn table turned in an opposite direction to the lower turn table, and the internal gear and the sun gear turned in the same direction as the lower turn table, whereby the polished-off thickness of back side was controlled by changing of lower turn table speed. However, it should be noted that the turning direction and speed setting of each turntable and each gear is not limited to the above-embodiment. The same object maybe achieved if the ratio of the polished-off thickness on the back side is controlled against the front side. By making the turning speed of the internal gear and the sun gear different, the uniformity of polishing is improved while rotating the polish carrier.

The polishing examples of the present invention are described herein.

EXAMPLE 1

Figure 1:
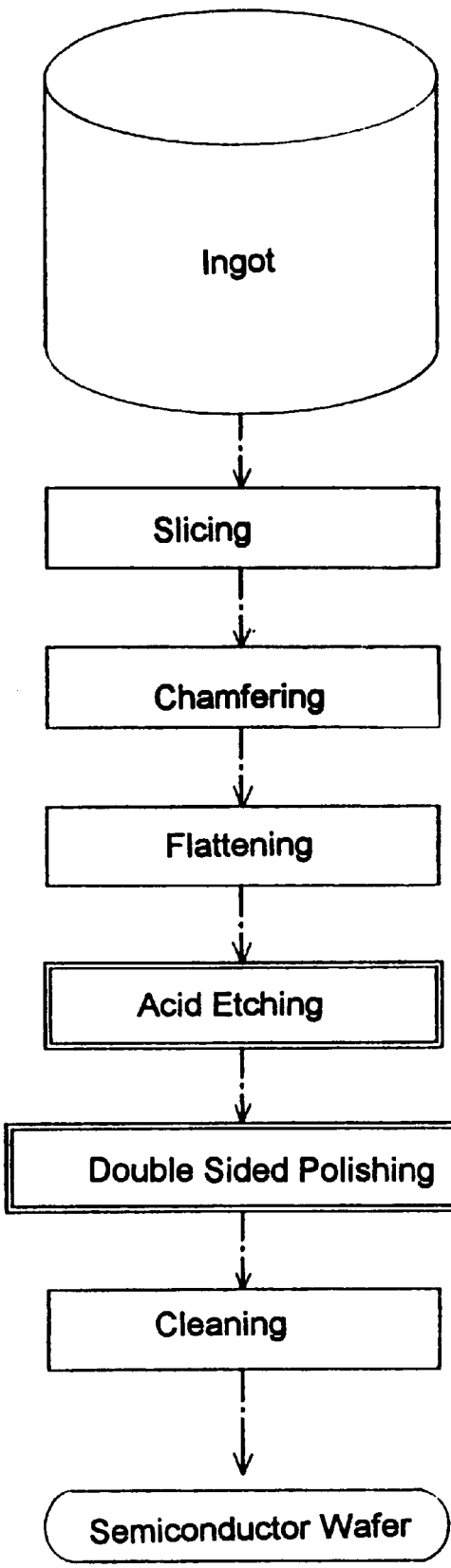
FIG. 1 is a flow chart of the method of making semiconductor wafers of Example 1.

As shown in FIG. 1, the method of Example 1 comprises the following steps.

Figure 2:
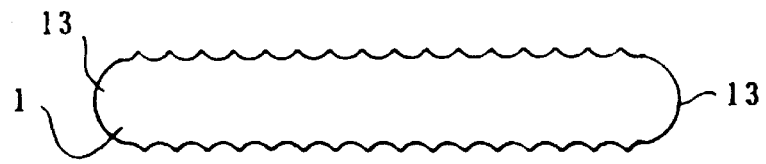
FIG. 2 illustrates sectional side elevations of the semiconductor wafers which are made by the method of Example 1.
Figure 2:
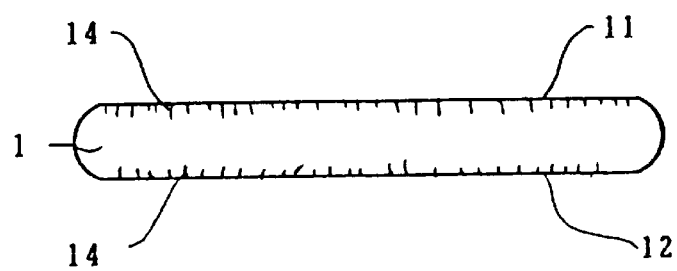
Figure 2:
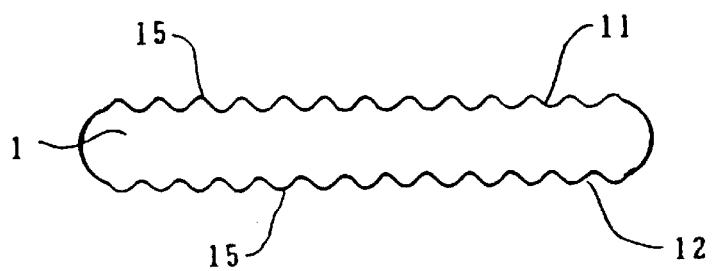
Figure 2:
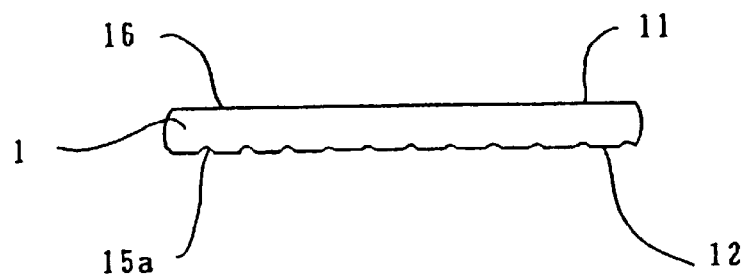

1. A semiconductor ingot was sliced to produce a wafer 1 (see FIG. 2(a)).
2. The periphery 13 of sliced wafer 1 was chamfered (see FIG. 2(a)).
3. The front side 11 and the back side 12 of chamfered wafer 1 were flattened by the lapping. During the lapping, process, work damaged areas 14 were produced on the front side 11 and the back side 12. (see FIG. 2(b))
4. The lapped wafer 1 was acid etched. (see FIG. 2(c)) A thickness of 20 $\mu$m was etched-off in about five minutes using a mixed acid etching solution containing about 40% hydrofluoric acid/nitric acid/acetic acid (HF/HNO$_3$/CH$_3$COOH), and the work damaged areas 14 which were formed by the lapping process were removed. A general flatness of whole surface of wafer 1 was attained by alkaline etching, however, an unevenness 15 of approximate 2.0 $\mu$m in peak-to-valley height is formed.
5. The etched wafer 1 was polished by using a double sided polishing apparatus. The upper turn table turned in an opposite direction to the lower turn table. The internal gear and the sun gear rotated in the same direction as the lower turn table. The condition of the polishing was set as previously mentioned, whereby, the front side of the wafer was polished by about 10 $\mu$m and the back side was polished by about 0.2 $\mu$m.
6. The double sided polished wafer 1 was cleaned. Thereby producing, a front side 11 having a mirror surface and unevenness 15a remained on the back side 12. The luster of the back side 12 produced during this example was about 82% (see FIG. 2(d)). As such, the sensor could distinguish the back side 12 from the front side 11.

A mixed acid solution of hydrofluoric acid/nitric acid (HF/HNO$_3$) and the other similar acidic chemical solutions can also be used as an acid etching solution.

In Example 1, presented above, each side of the wafer, front and back, is polished after the acid etching step removes the work damaged areas. However, the method of the present invention is not limited to the example presented above.

Figure 3:
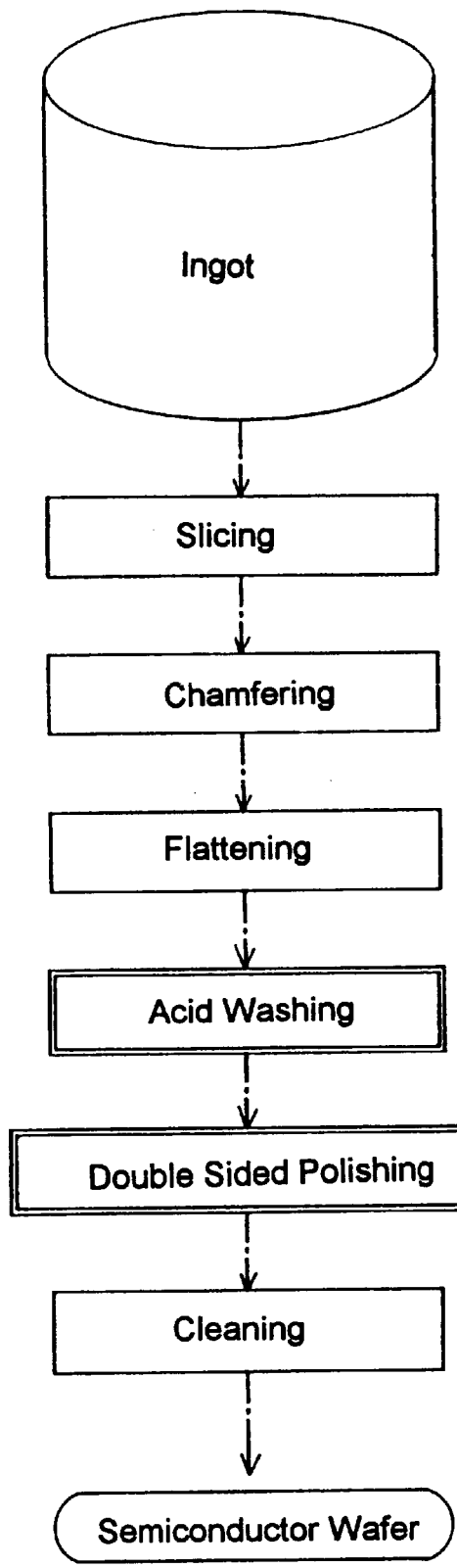
FIG. 3 is a flow chart of the method of making semiconductor wafers of Example 2.

For instance in Example 2, after lapping, as shown in FIG. 3, the wafer may be washed with a light mixed acid solution after lapping to remove impurities, such as lapping particles, from the work damaged areas. The steps of removing the work damaged areas and polishing may be simultaneously accomplished to produce a wafer that has the qualities of the previously mentioned example.

Instead of using lapping a flattening process for each of the above-mentioned examples, substituting grinding for the flattening process can make similar semiconductor wafers. Further, in order to improve the flatness of the wafer a spin etching method can be employed instead of the step of etching the wafer.

Using the methods of the present invention, a semiconductor wafer can be efficiently manufactured in which the front and back sides can be distinguished using a sensor or by visual inspection. In addition, deterioration of the flatness caused by polishing one side then the other side is prevented.

The foregoing discussion of the invention has been presented for purposes of illustration and description. Further, the description is not intended to limit the invention to the form disclosed herein. Consequently, variation and modification commensurate with the above teachings, within the skill and knowledge of the relevant art, are within the scope of the present invention. The embodiment described herein and above is further intended to explain the best mode presently known of practicing the invention and to enable others skilled in the art to utilize the invention as such, or in other embodiments, and with the various modifications required by their particular application or uses of the invention. It is intended that the appended claims be construed to include alternative embodiments to the extent permitted by the prior art.

What is claimed is:

1. A method of making semiconductor wafers comprising the following steps:

slicing a semiconductor ingot to obtain wafers having sliced surfaces;

flattening said sliced surfaces of said wafers to produce flattened wafers;

acid etching said surfaces of said flattened wafers to produce etched wafers;

simultaneously polishing front and back sides of said etched wafers using a double sided polishing apparatus, wherein said double sided polishing produces a first luster on said front side and a second luster, different from said first luster, on said back side, in order to distinguish said front side from said back side and cleaning said polished wafers.

2. A method of making semiconductor wafers, as claimed in claim 1, wherein:

said step of polishing removes a thickness on said back side that is ⅔ or less of a thickness removed from said front side.

3. A method of making semiconductor wafers, as claimed in claim 1, wherein:

an upper turntable is turned in an opposite direction to a lower turntable; and an internal gear and a sun gear are rotated in the same direction as said lower turntable so that a thickness polished-off from said backside is less than a thickness polished-off from said front side.

4. A method of making semiconductor wafers comprising the following steps:

slicing a semiconductor ingot to obtain wafers having sliced surfaces;

flattening sliced surfaces of said wafers producing flattened wafers;

washing said surfaces of said flattened wafers with an acid washing solution to remove impurities from work damaged areas formed by said flattening step;

polishing front and back sides of said washed wafers using a double sided polishing apparatus to remove said work damaged areas on said front side and producing a mirror surface on said front side, while simultaneously using said double sided polishing apparatus to polish said back side wherein said back side is polished to a lesser luster than said front side to distinguish said front side from said back side, thereof; and cleaning said polished wafers.

5. A method of making semiconductor wafers, as claimed in claim 4, wherein:

said step of polishing removes a thickness on said back side that is ⅔ or less of a thickness removed from said front side.

6. A method of making semiconductor wafers, as claimed in claim 2, wherein:

an upper turntable is turned in an opposite directions to a lower turntable; and an internal gear and a sun gear are rotated in the same direction as said lower turntable so that a thickness polished-off from said backside is less than a thickness polished-off from said front side.

7. A method for manufacturing semiconductor wafers comprising:

slicing a semiconductor ingot to obtain wafers having sliced surfaces;

flattening sliced surfaces of said wafers producing flattened wafers;

washing said surfaces of said flattened wafers with an acid washing solution to remove impurities from work damaged areas formed by said flattening step; and simultaneously differentially polishing front and back sides of said washed wafers in a step of double sided polishing wherein said front side is polished at a first rate to achieve a first luster, wherein said back side is polished at a second rate during said step of simultaneously differentially polishing to achieve a second luster, and wherein said second rate is less than said first rate.

* * * * *

UNITED STATES PATENT AND TRADEMARK OFFICE
CERTIFICATE OF CORRECTION

PATENT NO. : 6,043,156
DATED : March 28, 2000
INVENTOR(S) : KAI et al.

It is certified that error appears in the above-identified patent and that said Letters Patent is hereby corrected as shown below:

In col. 6, ln. 34, delete "2" and substitute --4-- therefor.

Signed and Sealed this

Twenty-seventh Day of February, 2001

Attest:

NICHOLAS P. GODICI

Attesting Officer     *Acting Director of the United States Patent and Trademark Office*